(12) United States Patent
Liu

(10) Patent No.: US 11,302,570 B2
(45) Date of Patent: Apr. 12, 2022

(54) INTERCONNECT STRUCTURE AND METHOD FOR FORMING THE SAME

(71) Applicant: Taiwan Semiconductor Manufacturing Co., Ltd., Hsinchu (TW)

(72) Inventor: Hsiang-Wei Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 216 days.

(21) Appl. No.: 16/257,809

(22) Filed: Jan. 25, 2019

(65) Prior Publication Data

US 2020/0243377 A1    Jul. 30, 2020

(51) Int. Cl.
| | |
|---|---|
| H01L 21/28 | (2006.01) |
| H01L 29/49 | (2006.01) |
| H01L 27/1157 | (2017.01) |
| H01L 21/768 | (2006.01) |
| H01L 23/522 | (2006.01) |
| H01L 21/3213 | (2006.01) |
| H01L 21/033 | (2006.01) |
| H01L 21/311 | (2006.01) |

(52) U.S. Cl.
CPC .... *H01L 21/76802* (2013.01); *H01L 21/0337* (2013.01); *H01L 21/31144* (2013.01); *H01L 21/32139* (2013.01); *H01L 21/76877* (2013.01); *H01L 23/5226* (2013.01)

(58) Field of Classification Search
None
See application file for complete search history.

(56) References Cited

U.S. PATENT DOCUMENTS

| | | | |
|---|---|---|---|
| 2003/0170978 A1* | 9/2003 | Lee | H01L 21/76813 438/638 |
| 2009/0186477 A1* | 7/2009 | Shin | H01L 21/76802 438/618 |
| 2009/0267162 A1* | 10/2009 | Nakajima | H01L 21/823857 257/410 |
| 2012/0313251 A1* | 12/2012 | Kato | H01L 21/76897 257/773 |
| 2017/0288031 A1* | 10/2017 | Ho | H01L 29/66545 |
| 2018/0061843 A1* | 3/2018 | Kim | H01L 27/11524 |

\* cited by examiner

*Primary Examiner* — Joseph C. Nicely
*Assistant Examiner* — Lamont B Koo
(74) *Attorney, Agent, or Firm* — Birch, Stewart, Kolasch & Birch, LLP

(57) ABSTRACT

A method for forming an interconnect structure is provided. The method for an interconnect structure includes forming a first metal material over a semiconductor substrate, and forming a first mask element over the first metal material. The first mask element has an opening through the first mask element. The method for forming the interconnect structure also includes forming a second metal material over the first mask element and the first metal material and in the opening, and forming a second mask element corresponding to the opening and over the second metal material. The method for forming the interconnect structure also includes etching the second metal material and the first metal material using the second mask element and the first mask element to form a via and a first metal line respectively.

20 Claims, 22 Drawing Sheets

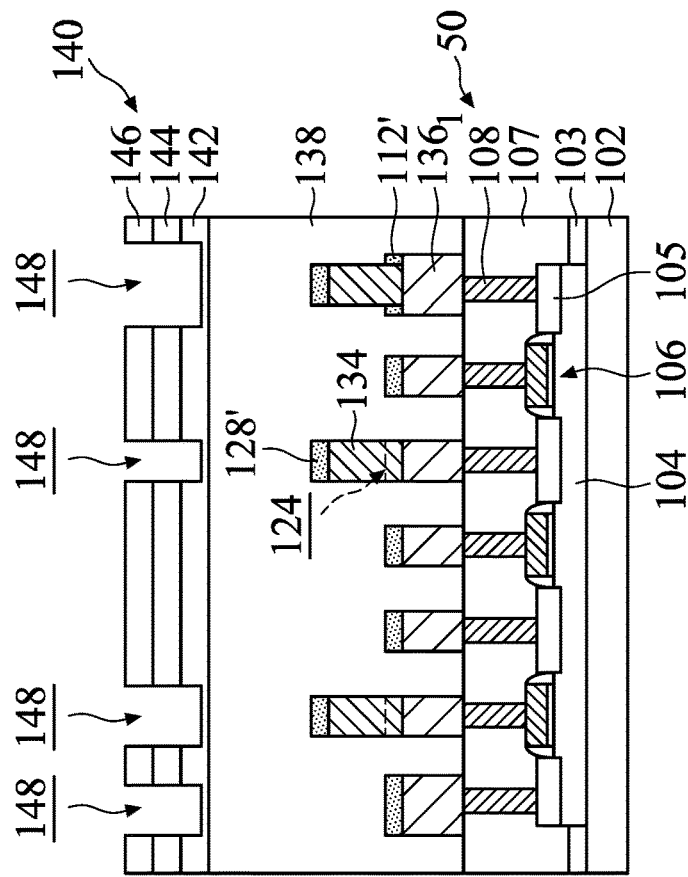
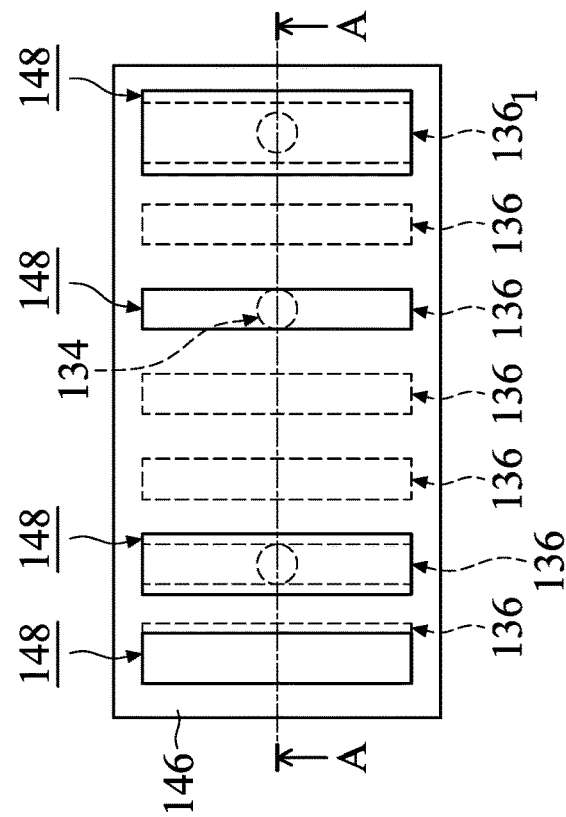
FIG. 1L-2
FIG. 1L-1

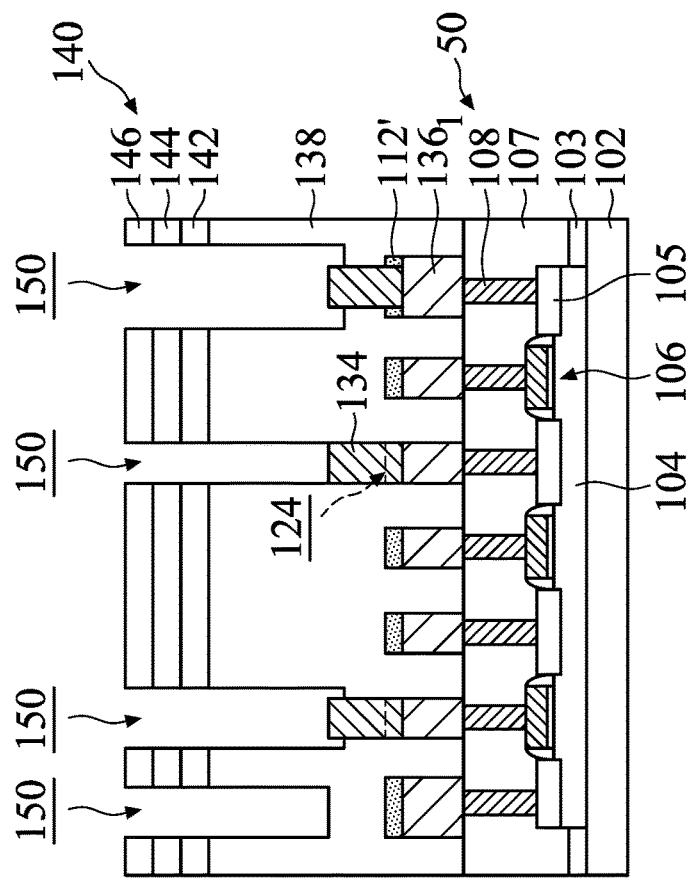
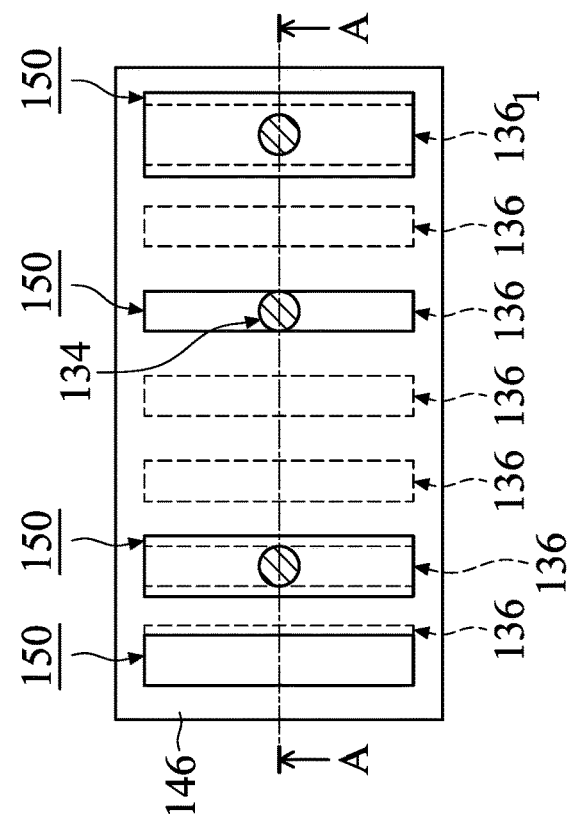
FIG. 1M-2
FIG. 1M-1

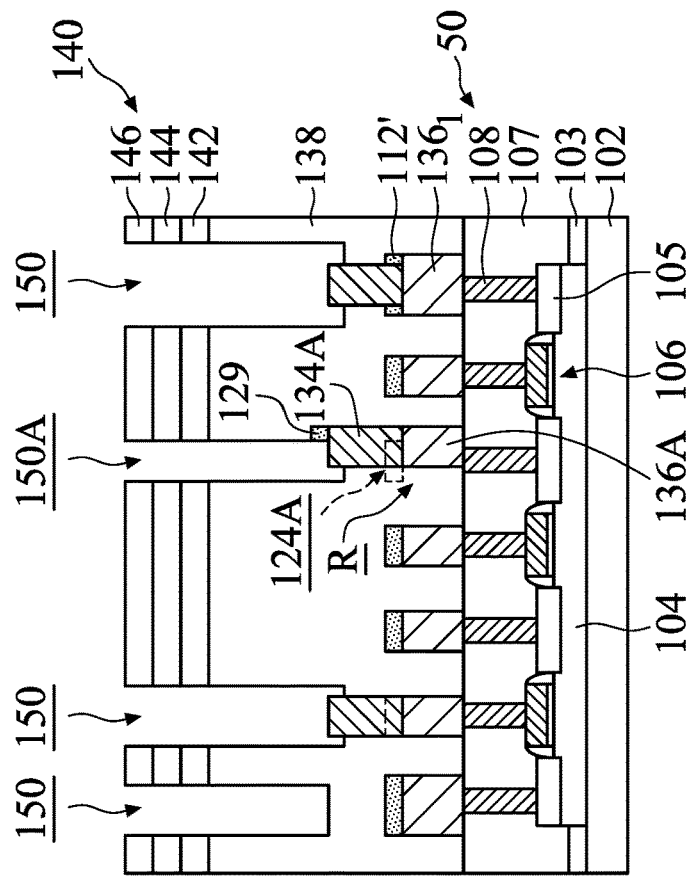
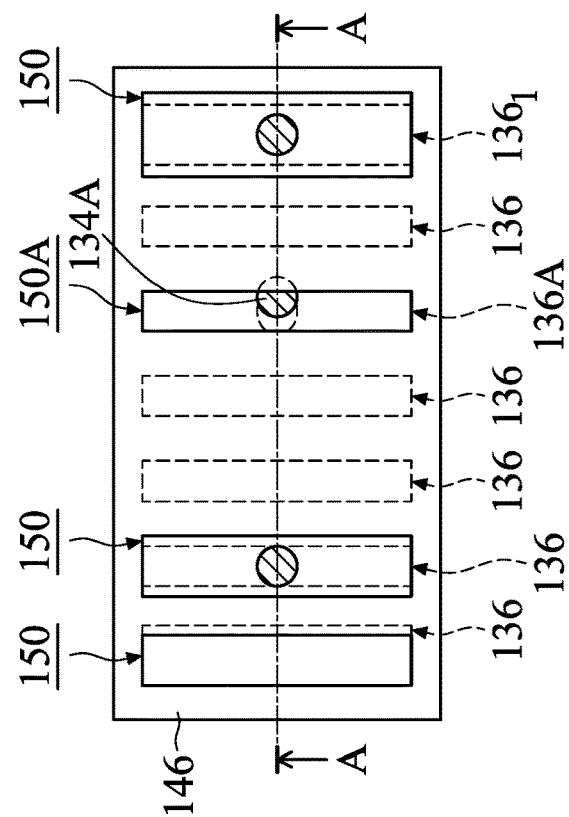
FIG. 2E-2
FIG. 2E-1

INTERCONNECT STRUCTURE AND METHOD FOR FORMING THE SAME

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced increased complexity into the semiconductor manufacturing process. Thus, the realization of continued advances in semiconductor ICs and devices calls for similar advances in semiconductor manufacturing processes and technology.

In the fabrication of semiconductor devices, the size of semiconductor devices has been continuously reduced in order to increase device density. Accordingly, a multi-layered interconnect structure is provided. The interconnect structure may include one or more conductive lines and via layers.

Although existing interconnect structures and methods for forming interconnect structures have been generally adequate for their intended purposes, they have not been entirely satisfactory in all respects.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 1A-1 through 1O-1 are top views illustrating the formation of a semiconductor device at various intermediate stages, in accordance with some embodiments.

FIGS. 1A-2 through 1O-2 are cross-sectional views of the semiconductor device along line A-A in FIGS. 1A-1 through 1O-1, in accordance with some embodiments.

FIGS. 2A-1 through 2F-1 are top views illustrating the formation of a semiconductor device at various intermediate stages, in accordance with some embodiments.

FIGS. 2A-2 through 2F-2 are cross-sectional views of the semiconductor device along line A-A in FIGS. 2A-1 through 2F-1, in accordance with some embodiments.

FIG. 2D-3 is an enlarged view of region A of FIG. 2D-1, in accordance with some embodiments.

DETAILED DESCRIPTION

Figures 1, 1A:
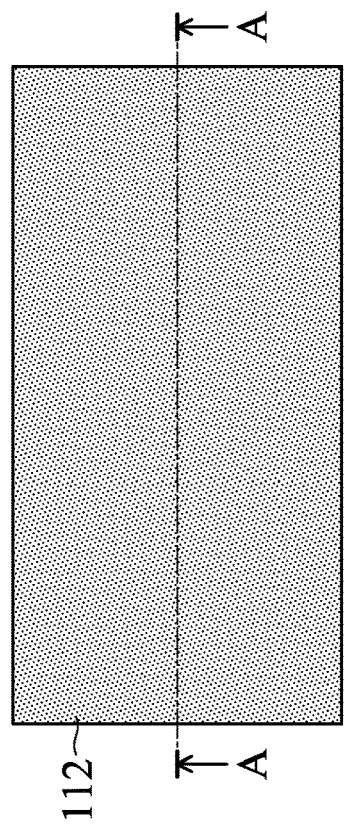

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments for forming an interconnect structures of semiconductor devices are provided. Generally, interconnect structures include multilayered metal lines and vias to provide various electrical connection paths. For example, one approach to forming metal lines and vias is with a damascene process (such as single damascene and/or dual damascene). The method of the embodiments for forming the interconnect structure may include forming a second metal material over a first metal material, and etching the second metal material and the first metal material using the same mask element to form a via and a metal line respectively, such that the via can be self-aligned to the underlying metal line. As a result, the via-to-line overlay performance can be enhanced.

FIGS. 1A-1 through 1O-1 are top views illustrating the formation of a semiconductor device 100 at various intermediate stages, in accordance with some embodiments. FIGS. 1A-2 through 1O-2 are cross-sectional views of the semiconductor device 100 along line A-A in FIGS. 1A-1 through 1O-1, in accordance with some embodiments.

Figures 1, 1A, 2:
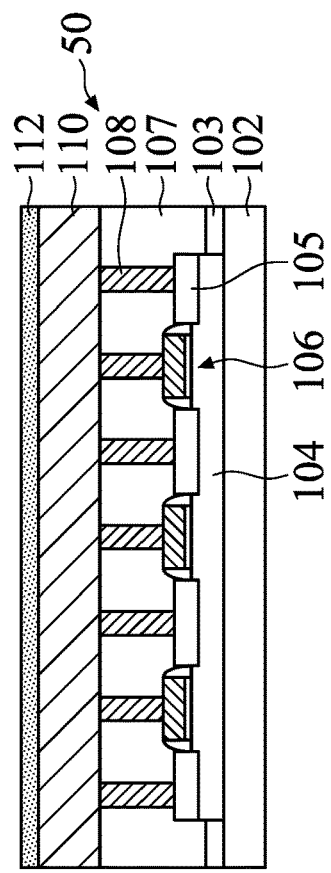

A FinFET device structure 50 is provided, as shown in FIG. 1A-2, in accordance with some embodiments. The formation of the FinFET device structure 50 includes providing a substrate 102, and forming a fin structure 104 and an isolation structure 103 on the substrate 102, in accordance with some embodiments. The fin structure 104 protrudes from the isolation structure 103, in accordance with some embodiments. The isolation structure 103 surrounds a lower portion of the fin structure 104, in accordance with some embodiments.

In some embodiments, the substrate 102 is a semiconductor substrate such as a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP;

or a combination thereof. In some embodiments, the substrate 102 includes an epitaxial layer (epi-layer) overlying a bulk semiconductor substrate. In some embodiments, the substrate 102 is a semiconductor-on-insulator (SOI) substrate which may include a semiconductor substrate, a buried oxide layer over the substrate, and a semiconductor layer over the buried oxide layer.

In some embodiments, the formation of the fin structure 104 includes recessing the structure 102 to form trenches. In some embodiments, the fin structure 104 is formed between the trenches.

The trenches are filled with an insulating material for the isolation structure 103, in accordance with some embodiments. The insulating material is also formed over the upper surface of the fin structure 104, in accordance with some embodiments. In some embodiments, the insulating material includes silicon oxide, silicon nitride, silicon oxynitride (SiON), another suitable insulating material, and/or a combination thereof. In some embodiments, the insulating material is formed using chemical vapor deposition (CVD) such as low pressure CVD (LPCVD), plasma enhanced CVD (PECVD), or high density plasma CVD (HDP-CVD), high aspect ratio process (HARP), flowable CVD (FCVD)); atomic layer deposition (ALD); another suitable method, and/or a combination thereof.

The insulating material over the upper surface of the fin structure 104 is removed, for example, using chemical mechanical polishing (CMP), in accordance with some embodiments. Afterward, the insulating material is etched back to expose sidewalls of an upper portion of the fin structure 104 and form the isolation structure 103 surrounding a lower portion of the fin structure 104, in accordance with some embodiments.

The formation of the FinFET device structure 50 further includes forming gate structures 106 across the fin structure 104, and forming source/drain features 105 on opposite sides of the gate structures 106 on the fin structure 104, as shown in FIG. 1A-2, in accordance with some embodiments.

The gate structures 106 cover the sidewalls (not shown in FIG. 1A-2) and the upper surface of the fin structure 104, in accordance with some embodiments. Each of the gate structures 106 includes a gate dielectric layer, a gate electrode layer, and a gate spacer layer, in accordance with some embodiments. In some embodiments, the gate dielectric layer is conformally formed along the sidewalls and the upper surface of the fin structure 104. In some embodiments, the gate electrode layer is formed on the gate dielectric layer along the sidewalls and the upper surface of the fin structure 104. In some embodiments, the gate spacer layer is formed along the sidewalls of the gate electrode layer.

In some embodiments, the gate dielectric layer is made of one or more layers of a dielectric material, such as silicon oxide, silicon nitride, silicon oxynitride (SiON), and/or a combination thereof. In some embodiments, the gate dielectric layer is made of a dielectric material with high dielectric constant (k value), such as $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, another suitable high-k dielectric material, and/or a combination thereof. In some embodiments, the dielectric material is formed using a thermal oxidation, CVD, ALD, physical vapor deposition (PVD), another suitable method, and/or a combination thereof.

In some embodiments, the gate electrode layer is made of one or more layers of conductive material, such as polycrystalline-silicon (poly-Si), poly-crystalline silicon-germanium (poly-SiGe), metallic nitrides, metallic silicides, metals, and/or a combination thereof. In some embodiments, the conductive material is formed using CVD, PVD, and/or a combination thereof.

In some embodiments, the gate spacer layer is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof.

The formation of the source/drain features 105 includes recessing the fin structure 104 to form source/drain recesses on opposite sides of the gate structures 106, in accordance with some embodiments. Afterward, the source/drain features 105 are grown in the source/drain recesses using an epitaxial growth process, in accordance with some embodiments.

In some embodiments, the source/drain features 105 are in-situ doped during the epitaxial growth process. For example, the source/drain features 105 may be the epitaxially grown SiGe doped with boron (B). For example, the source/drain features 105 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features.

The formation of the FinFET device structure 50 further includes forming an interlayer dielectric (ILD) layer 107 over the fin structure 104 and forming contacts 108 through the ILD layer 107, as shown in FIG. 1A-2, in accordance with some embodiments. The ILD layer 107 covers the isolation structure 103, the fin structure 104, the source/drain features 105, and the gate structures 106, in accordance with some embodiments. The contacts 108 penetrate through the ILD layer 107 and land on the source/drain features 105 and the gate structures 106, in accordance with some embodiments.

In some embodiments, the ILD layer 107 is made of a dielectric material, such as tetraethylorthosilicate (TEOS) oxide, un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the dielectric material for the ILD layer 107 is formed using CVD (such as HDP-CVD, PECVD, or HARP), ALD, another suitable method, and/or a combination thereof.

In some embodiments, the contacts 108 are made of a one or more conductive materials, for example, cobalt (Co), nickel (Ni), tungsten (W), titanium (Ti), tantalum (Ta), cupper (Cu), aluminum (Al), ruthenium (Ru), molybdenum (Mo), TiN, TaN, and/or a combination thereof. In some embodiments, the contacts 108 include a silicide layer, such as WSi, NiSi, TiSi or CoSi, formed on the source/drain features 105.

In some embodiments, the formation of the contacts 108 includes patterning the ILD layer 108 to form contact openings through the ILD layer 107 and exposing the source/drain features 105 and the gate structures 106. In some embodiments, the conductive material for the contacts 108 fills the contact openings and is formed over the upper surface of the ILD layer 107. In some embodiments, a planarization process such as CMP is performed on the conductive material until the upper surface of the ILD layer 107 is exposed.

An interconnect structure is formed over the FinFET device structure 50, in accordance with some embodiments. The interconnect structure includes multilayered metal lines and vias, in accordance with some embodiments. The methods for forming the interconnect structure is described in detail below.

A first metal material 110 is formed over the ILD layer 107, as shown in FIG. 1A-2, in accordance with some embodiments. The first metal material 110 covers the upper surfaces of the ILD layer 107 and the contacts 108, in accordance with some embodiments. The first metal material 110 is used to form metal lines, in accordance with some embodiments. In some embodiments, the first metal material 110 has a thickness in a range from about 5 nm to about 50 nm.

In some embodiments, the first metal material 110 is copper (Cu), cobalt (Co), ruthenium (Ru), molybdenum (Mo), multilayers thereof, an alloy thereof, and/or a combination thereof. In some embodiments, the first metal material 110 is formed using CVD, ALD, PVD, and/or a combination thereof. In some embodiments, the first metal material 110 formed using CVD or PVD has a greater grain size than the metal material formed using electroplating, which reduces the resistance of the resulting metal lines.

A first hard mask layer 112 is formed over the upper surface of the first metal material 110, as shown in FIGS. 1A-1 and 1A-2, in accordance with some embodiments. In some embodiments, the first hard mask layer 112 has a thickness in a range from about 1 nm to about 10 nm.

In some embodiments, the first hard mask layer 112 is made of a dielectric material such as SiN, SiOC, AlON, $Al_2O_3$, SiCN, and/or a combination thereof. In some embodiments, the first hard mask layer 112 is formed using CVD (such as PECVD or LPCVD), ALD, another suitable method, and/or a combination thereof.

Figures 1, 1B:
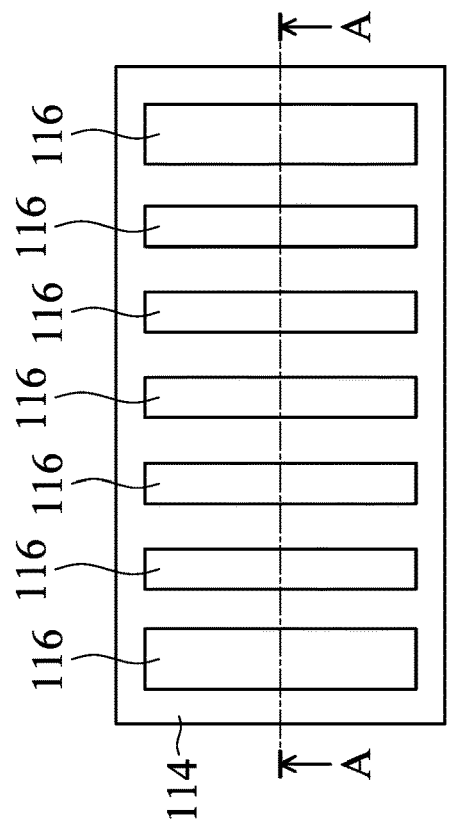
Figures 1, 1B, 2:
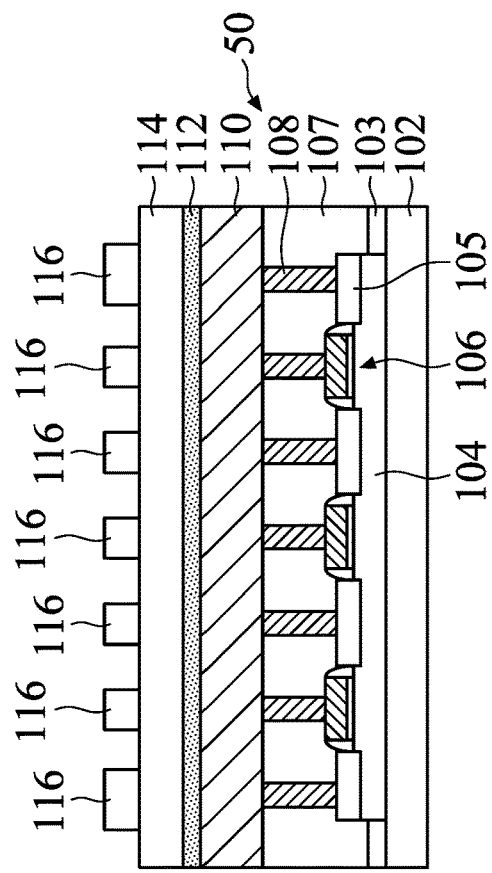

An antireflection layer 114 is formed over the upper surface of the first hard mask layer 112, as shown in FIGS. 1B-1 and 1B-2, in accordance with some embodiments. In some embodiment, the antireflection layer 114 is a bottom anti-reflective coating (BARC) layer which is used to reduce reflection during a following lithography process.

In some embodiments, the antireflection layer 114 is made of nitrogen-free material, such as silicon rich oxide or silicon oxycarbide (SiOC). In some embodiments, the antireflection layer 114 is formed using CVD (such as PECVD or LPCVD), ALD, another suitable method, and/or a combination thereof.

Photoresist patterns 116 are formed over the upper surface of the antireflection layer 114, as shown in FIGS. 1B-1 and 1B-2, in accordance with some embodiments. The photoresist patterns 116 have strip shapes which are substantially parallel to each other in the top view of FIGS. 1B-1, in accordance with some embodiments. In some embodiments, the photoresist patterns 116 have different widths.

In some embodiments, the photoresist patterns 116 are made of a positive photoresist material or a negative photoresist material, for example, Poly (methyl methacrylate) (PMMA), Poly (methyl glutarimide) (PMGI), or Phenol formaldehyde resin (DNQ/Novolac). In some embodiments, the photoresist patterns 116 are formed by coating a photoresist material over the upper surface of the antireflection layer 114 and patterning the photoresist material using a lithography process.

Figures 1, 1C, 2:
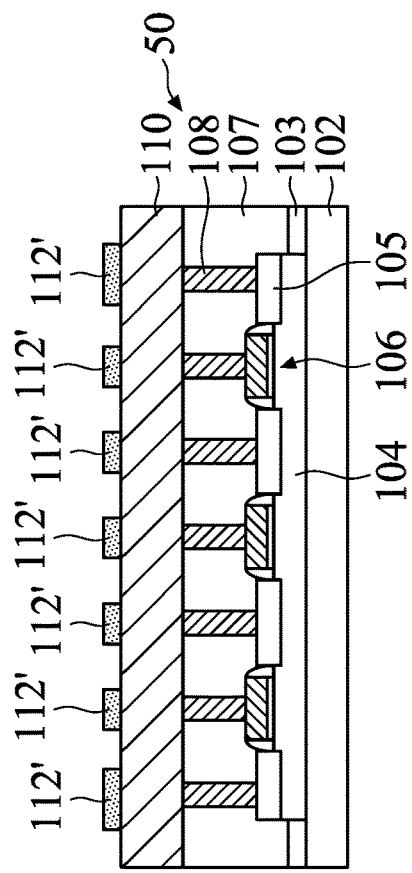
Figures 1, 1C:
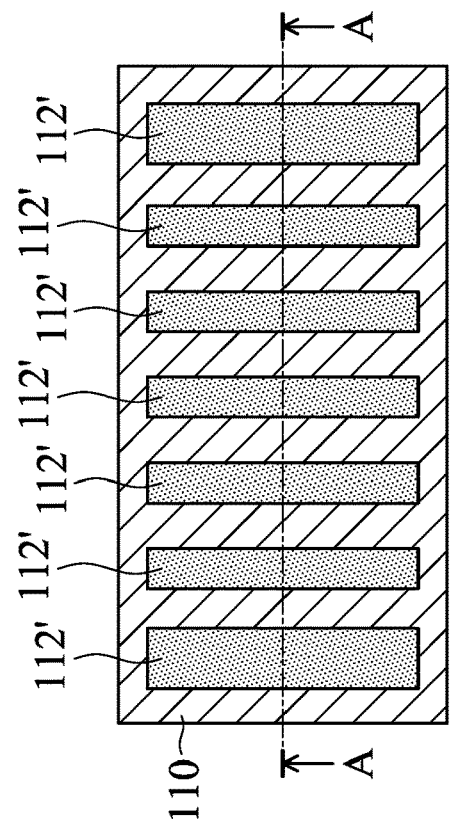

The first hard mask layer 112 is patterned into first mask elements 112', as shown in FIGS. 1C-1 and 1C-2, in accordance with some embodiments. The pattern of the photoresist patterns 116 is transferred to the first hard mask layer 112 to form the first mask elements 112', in accordance with some embodiments. The first mask elements 112' have strip shapes which are substantially parallel to each other in the top view of FIGS. 1C-1, in accordance with some embodiments. In some embodiments, the first mask elements 112' have different widths. After the first mask elements 112' are formed, the photoresist patterns 116 and the antireflection layer 114 are removed, in accordance with some embodiments.

The formation of the first mask elements 112' includes etching the antireflection layer 114 and the first hard mask layer 112 uncovered by the photoresist patterns 116 to expose the upper surface of the first metal material 110, in accordance with some embodiments. In some embodiments, the etching process includes a dry etching process such as reactive ion etch (RIE), electron cyclotron resonance (ERC) etch, inductively-coupled plasma (ICP) etch, neutral beam etch (NBE), and/or a combination thereof.

Figures 1, 1D, 2:
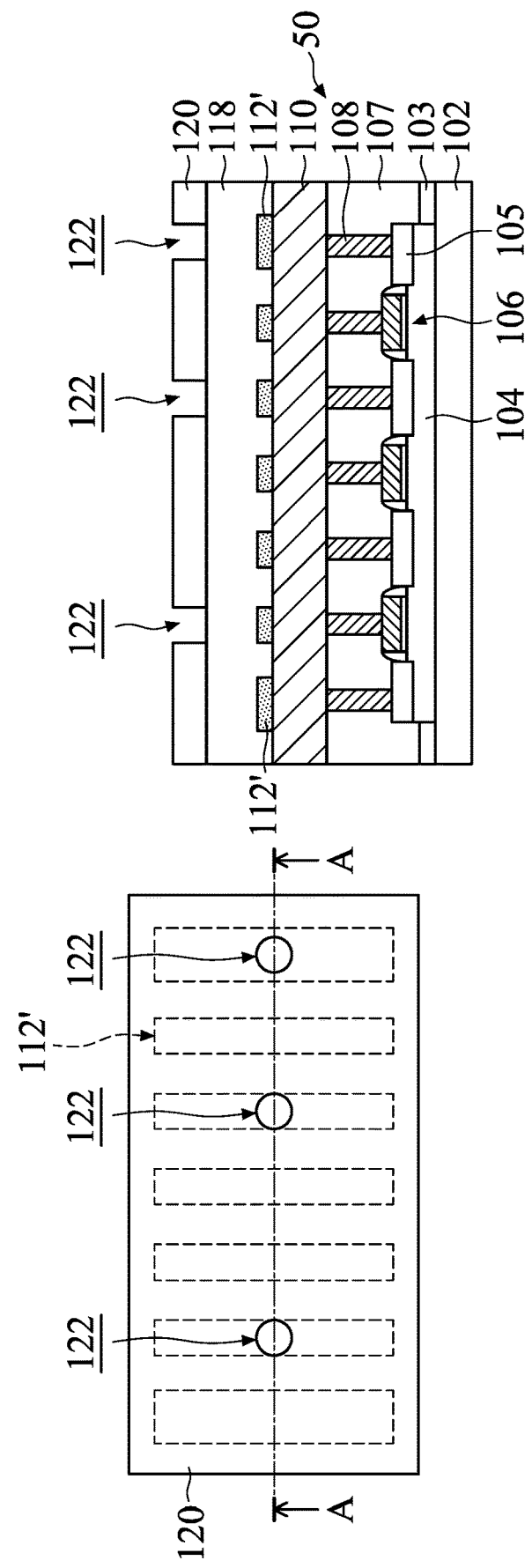

An antireflection layer 118 is formed over the upper surface of the first metal material 110, as shown in FIGS. 1D-1 and 1D-2, in accordance with some embodiments. The antireflection layer 118 covers the sidewalls and the upper surfaces the first mask elements 112'. In some embodiment, the antireflection layer 118 is a BARC layer which is used to reduce reflection during a following lithography process.

In some embodiments, the antireflection layer 118 is made of nitrogen-free material, such as silicon rich oxide or silicon oxycarbide (SiOC). In some embodiments, the antireflection layer 118 is formed using CVD (such as PECVD or LPCVD), ALD, another suitable method, and/or a combination thereof.

A patterned photoresist layer 120 is formed over the upper surface of the antireflection layer 118, as shown in FIGS. 1D-1 and 1D-2, in accordance with some embodiments. The patterned photoresist layer 120 has openings 122 exposing the upper surface of the antireflection layer 118, in accordance with some embodiments. The openings 122 are located directly above the first mask elements 112', in accordance with some embodiments. Each of the openings 122 is substantially aligned to one first mask element 112', in accordance with some embodiments. In some embodiments, the opening 122 has a round shape or a rectangular shape in the top view. In some embodiments, the width of the opening 122 is equal to the width of the first mask element 112'. In some embodiments, the width of the opening 122 is less than the width of the first mask element 112'.

In some embodiments, the patterned photoresist layer 120 is made of a positive photoresist material or a negative photoresist material, for example, PMMA, PMGI, or Phenol formaldehyde resin (DNQ/Novolac). In some embodiments, the patterned photoresist layer 120 is formed by coating a photoresist material over the upper surface of the antireflection layer 118 and patterning the photoresist material using a lithography process.

Figures 1, 1E, 2:
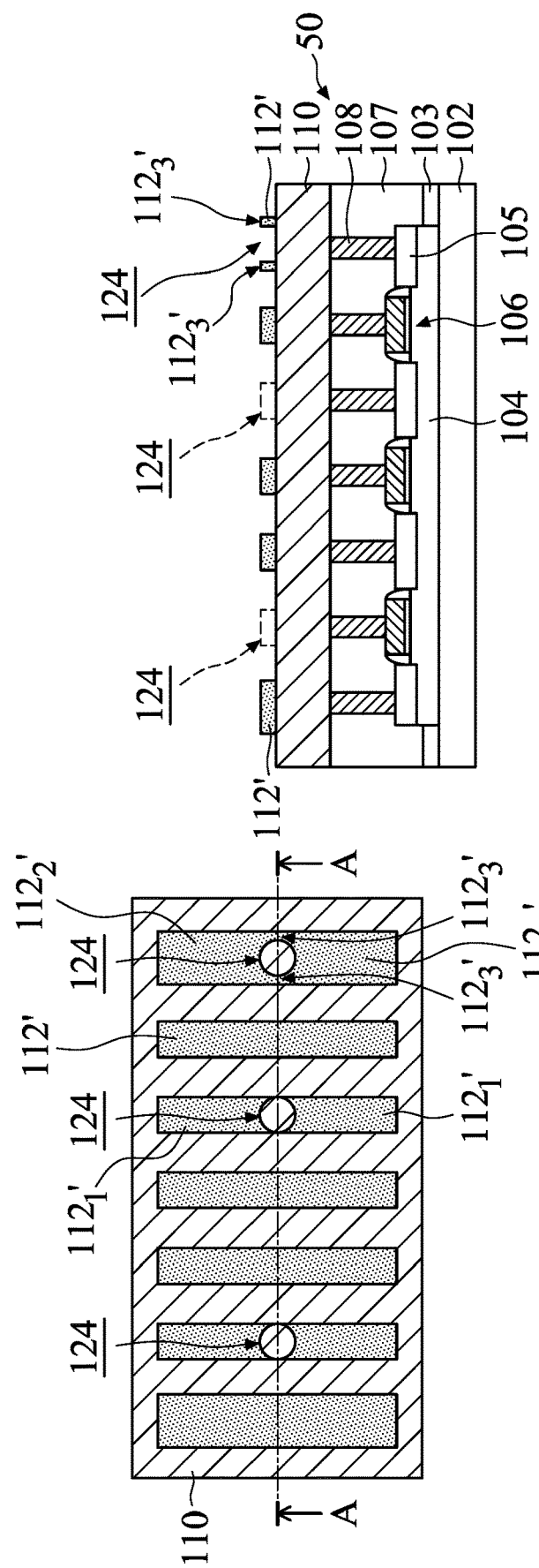

The first mask elements 112' are patterned to form openings 124, as shown in FIGS. 1E-1 and 1E-2, in accordance with some embodiments. The openings 124 penetrate through the first mask elements 112' and expose the upper surface of the first metal material 110, in accordance with some embodiments. After the patterning process of first mask elements 112', the patterned photoresist layer 120 and the antireflection layer 118 are removed, in accordance with some embodiments.

In some embodiments, the opening 124 has the same width as the first mask element 112' so that the first mask element 112' is cut into two separate sections $112_k'$. In some embodiments, the opening 124 has a width less than the first mask element 112' so that the first mask element 112' has two sections $112_2'$ which are connected through connecting portions 112₃'. In some embodiments, the connecting portions 112₃' are formed on opposite sides of the opening 124.

The patterning process of the first mask elements 112' includes etching the antireflection layer 118 and the first mask elements 112' through the openings 122 of the patterned photoresist layer 120, in accordance with some embodiments. In some embodiments, the etching process includes a dry etching process such as RIE, ERC etch, ICP etch, NBE, and/or a combination thereof.

Figures 1, 1F, 2:
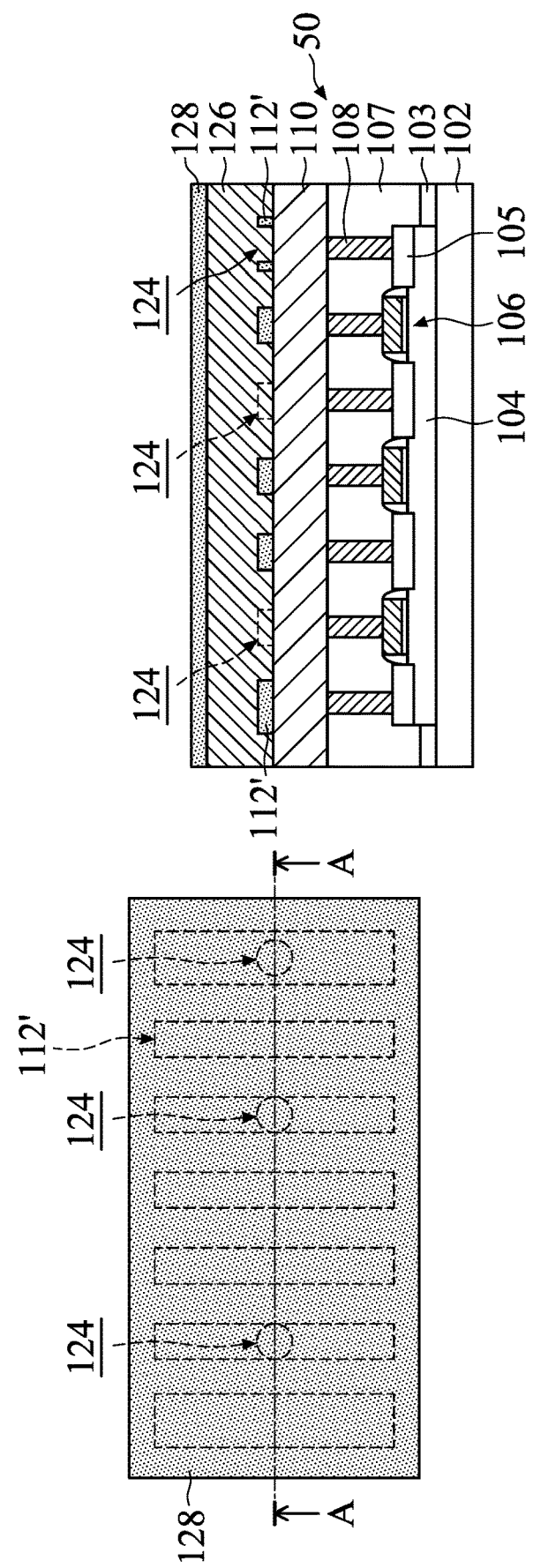

A second metal material 126 is formed over the first metal material 110 and the first mask elements 112', as shown in FIGS. 1F-1 and 1F-2, in accordance with some embodiments. The second metal material 126 covers the upper surface of the first metal material 110 and the sidewalls and upper surfaces of the first mask elements 112', in accordance with some embodiments. The second metal material 126 is filled into the openings 124 to contact the first mask elements 112', in accordance with some embodiments. The second metal material 126 is used to form vias, in accordance with some embodiments. In some embodiments, the second metal material 126 has a thickness in a range from about 5 nm to about 50 nm.

In some embodiments, the second metal material 126 is copper (Cu), cobalt (Co), ruthenium (Ru), molybdenum (Mo), multilayers thereof, an alloy thereof, and/or a combination thereof. In some embodiments, the second metal material 126 is formed using CVD, ALD, PVD, and/or a combination thereof. The second metal material 126 formed using CVD or PVD has a greater grain size than the metal material formed using electroplating, which reduces the resistance of the resulting vias.

A second hard mask layer 128 is formed over the upper surface of the second metal material 126, as shown in FIGS. 1F-1 and 1F-2, in accordance with some embodiments.

In some embodiments, the second hard mask layer 128 is made of a dielectric material such as SiN, SiOC, AlON, Al₂O₃, SiCN, and/or a combination thereof. In some embodiments, the second hard mask layer 128 is formed using CVD (such as PECVD or LPCVD), ALD, another suitable method, and/or a combination thereof.

Figures 1, 1G, 2:
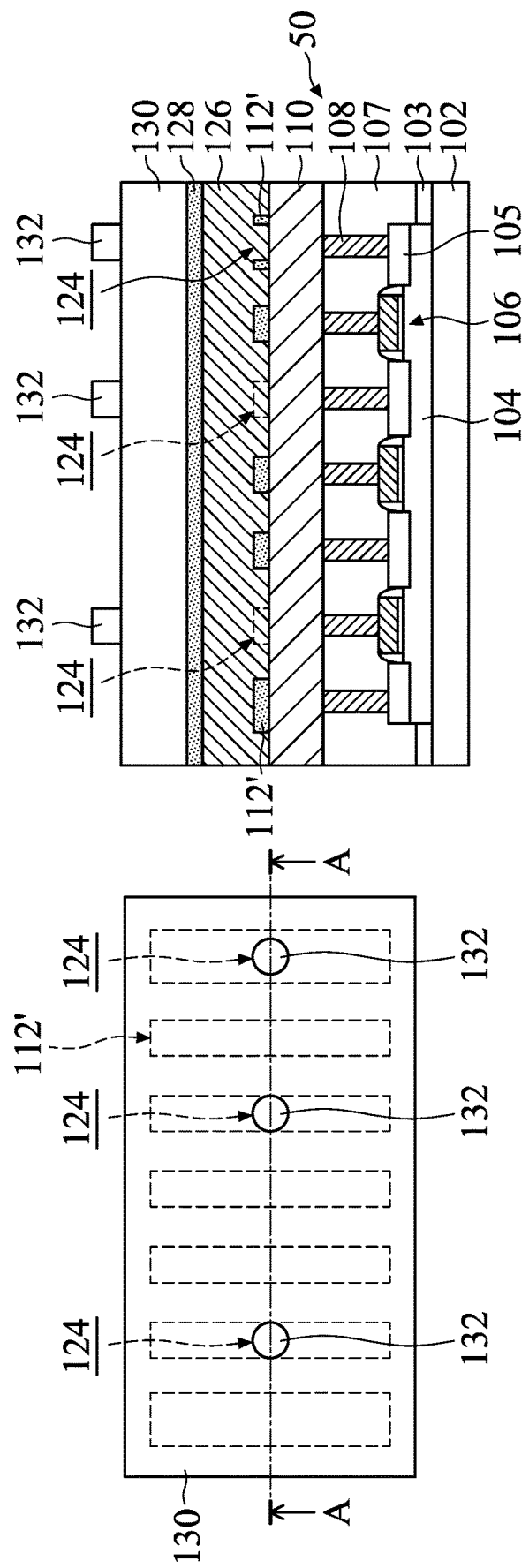

An antireflection layer 130 is formed over the upper surface of the second hard mask layer 128, as shown in FIGS. 1G-1 and 1G-2, in accordance with some embodiments. In some embodiment, the antireflection layer 130 is a BARC layer which is used to reduce reflection during a following lithography process.

In some embodiments, the antireflection layer 130 is made of nitrogen-free material, such as silicon rich oxide or silicon oxycarbide (SiOC). In some embodiments, the antireflection layer 130 is formed using CVD (such as PECVD or LPCVD), ALD, another suitable method, and/or a combination thereof.

Photoresist patterns 132 are formed over the upper surface of the antireflection layer 130, as shown in FIGS. 1G-1 and 1G-2, in accordance with some embodiments. The photoresist patterns 132 are located directly above the openings 124, in accordance with some embodiments. Each of the photoresist patterns 132 is substantially aligned to and covers one opening 124, in accordance with some embodiments. In some embodiments, the photoresist patterns 132 have a shape similar to the opening 124 in the top view, for example, a round shape or a rectangular shape. In some embodiments, the width of the photoresist pattern 132 is equal to the width of opening 124.

In some embodiments, the photoresist patterns 132 are made of a positive photoresist material or a negative photoresist material, for example, PMMA, PMGI, or Phenol formaldehyde resin (DNQ/Novolac). In some embodiments, the photoresist patterns 132 are formed by coating a photoresist material over the upper surface of the antireflection layer 130 and patterning the photoresist material into the photoresist patterns 132 using a lithography process.

Figures 1, 1H, 2:
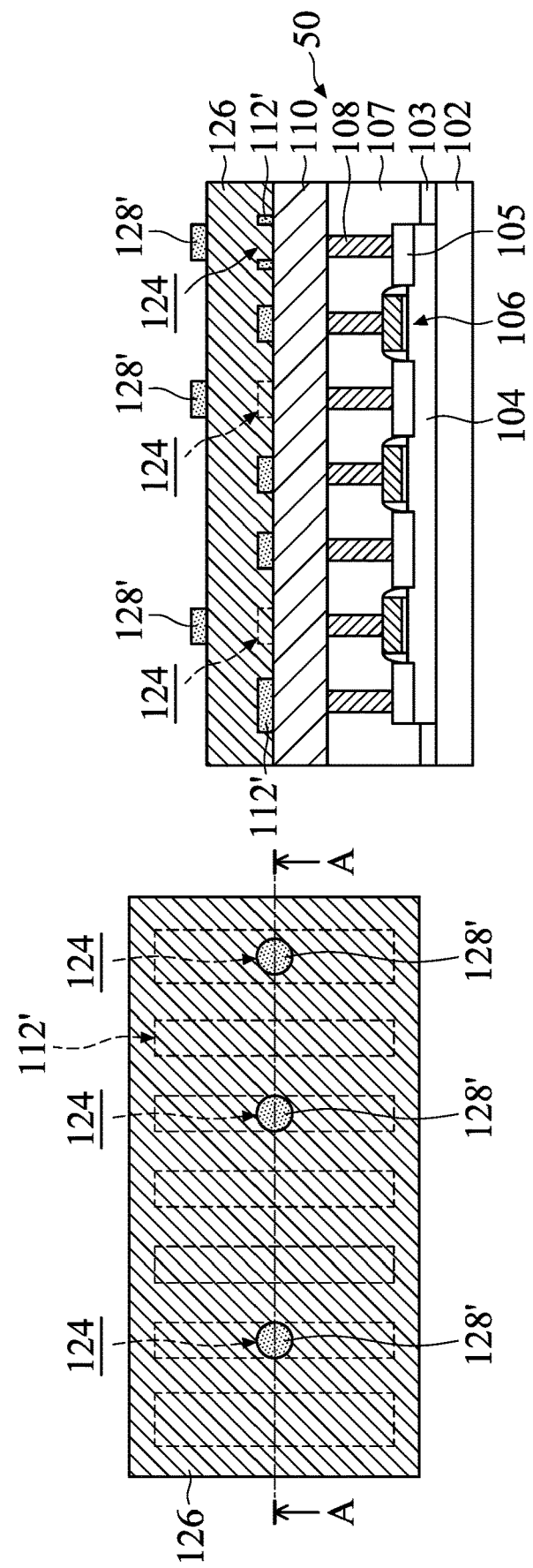

The second hard mask layer 128 is patterned into second mask elements 128', as shown in FIGS. 1H-1 and 1H-2, in accordance with some embodiments. The pattern of the photoresist patterns 132 are transferred to the second hard mask layer 128 to form the second mask elements 128' corresponding to the openings 124 of the first mask elements 112', in accordance with some embodiments. The second mask elements 128' are located directly above the openings 124, in accordance with some embodiments. Each of the second mask elements 128' is substantially aligned to and covers one opening 124, in accordance with some embodiments. In some embodiments, the second mask elements 128' have a shape similar to the opening 124 in the top view, for example, a round shape or a rectangular shape. In some embodiments, the width of the second mask elements 128' is equal to the width of opening 124.

The formation of the second mask elements 128' includes etching the antireflection layer 130 and the second hard mask layer 128 uncovered by the photoresist patterns 132 to expose the upper surface of the second metal material 126, in accordance with some embodiments. In some embodiments, the etching process includes a dry etching process such as RIE, ERC etch, ICP etch, NBE, and/or a combination thereof.

Figures 1, 1I, 2:
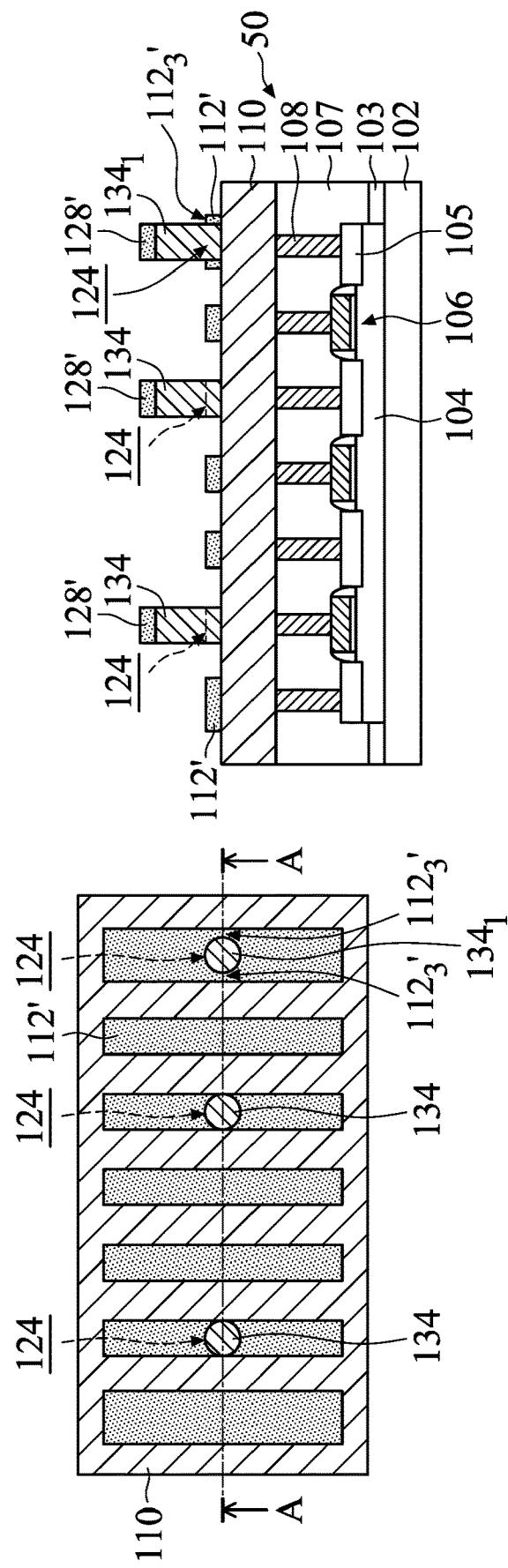

The second metal material 126 is etched using the second mask elements 128' to form vias 134, as shown in FIGS. 1I-1 and 1I-2, in accordance with some embodiments. The second metal material 126 uncovered by the second mask elements 128' is removed to expose the first metal material 110, in accordance with some embodiments. After the etching process, the second metal material 126 covered by the second mask elements 128' remains to serve as the vias 134, in accordance with some embodiments. The openings 124 are filled by the vias 134, in accordance with some embodiments. In some embodiments, the via 134 has the same width as the first mask element 112'. In some embodiments, the via 134₁ has a width less than the first mask element 112' and the connecting portions 112₃' are located on opposite sides of the via 134₁. In some embodiments, the etching process is a dry etching process such as RIE.

Figures 1, 1J, 2:
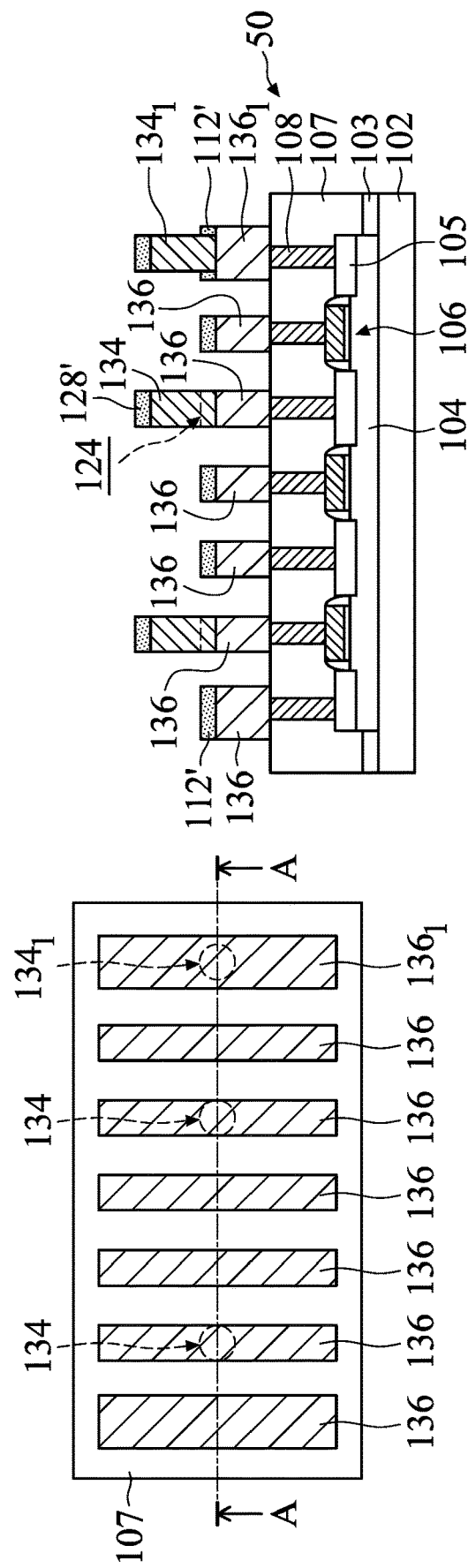

The first metal material 110 is etched using the second mask elements 128' and the first mask elements 112' to form first metal lines 136, as shown in FIGS. 1J-1 and 1J-2, in accordance with some embodiments. The first metal material 110 uncovered by the second mask elements 128' and the first mask elements 112' is removed to expose the ILD layer 107, in accordance with some embodiments. After the etching process, the first metal material 110 covered by the second mask elements 128' and the first mask elements 112' remains to serve as the first metal lines 136, in accordance with some embodiments. The first metal lines 136 are formed over and in contact with the contacts 108, in accordance with some embodiments. In some embodiments, the etching process is a dry etching process such as RIE.

Because the second mask element 128' is aligned to and covers the opening 124 of the first mask element 112', the pattern of the photoresist pattern 116 (shown in FIGS. 1B-1) may be completely transferred to the first metal line 136. The first metal lines 136 have strip shapes which are substantially parallel to each other in the top view, as shown in FIG. 1J-1, in accordance with some embodiments. In some embodiments, first metal lines 136 have a width in a range from about 5 nm to about 50 nm. In some embodiments, the spacing between adjacent first metal lines 136 is in a range from about 5 nm to about 50 nm.

In some embodiments, the via 134 has the same width as the first metal line 136. In some embodiments, the via $134_1$ has a width less than the first metal line $136_1$.

The vias 134 penetrate through the first mask elements 112' to land on the first metal lines 136, in accordance with some embodiments. The vias 134 are in direct contact with the first metal lines 136, in accordance with some embodiments.

The etching process of the second metal material 126 and the etching process of the first metal material 110 are in-situ performed in the same etching chamber, in accordance with some embodiments. The etching process of the second metal material 126 and the etching process of the first metal material 110 are continuously performed without interruption, in accordance with some embodiments.

Figures 1, 1K, 2:
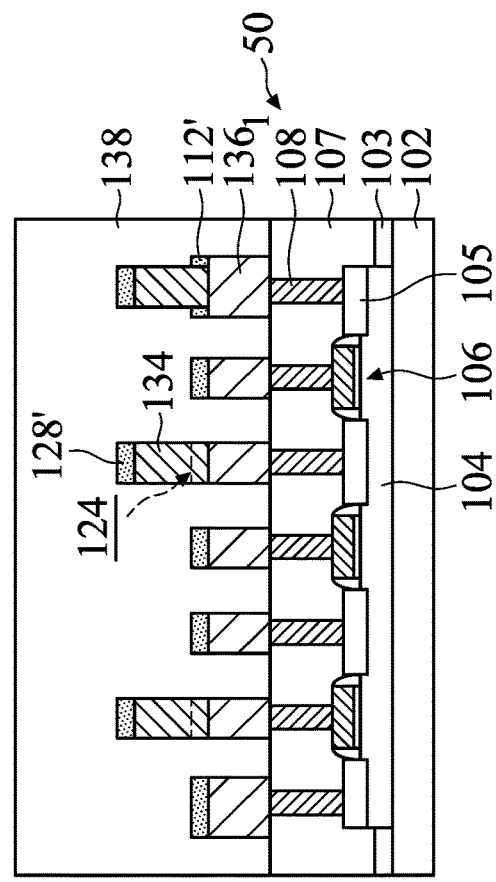
Figures 1, 1K:
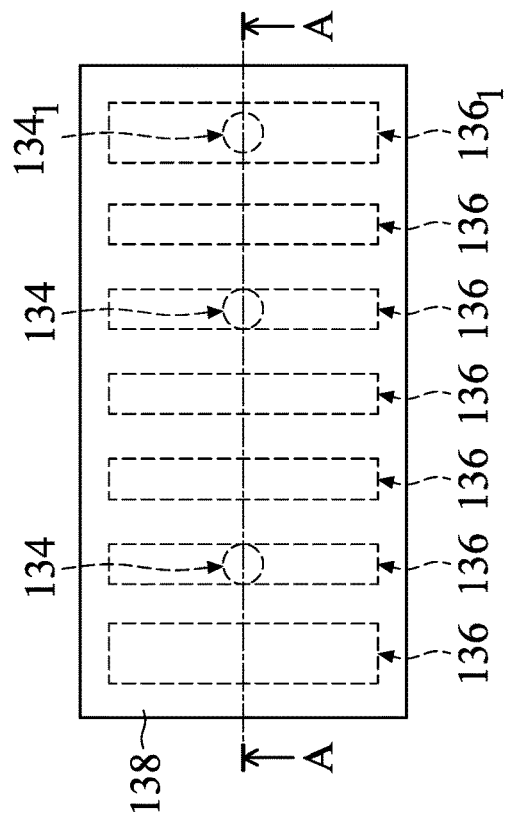

An inter-metal dielectric (IMD) layer 138 is formed over the upper surface of the ILD layer 107, as shown in FIGS. 1K-1 and 1K-2, in accordance with some embodiments. The IMD layer 138 covers the sidewalls and the upper surfaces of the first metal lines 136, the first mask elements 112', the vias 134, and the second mask elements 128', in accordance with some embodiments.

In some embodiments, the IMD layer 138 is made of one or more dielectric layers such as silicon oxide, silicon nitride, silicon carbide, silicon oxynitride, dielectric material (s) with low dielectric constant (low-k), and/or a combination thereof. In some embodiments, the IMD layer 138 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the IMD layer 138 is formed by CVD (such as PECVD) or spin coating.

A tri-layer mask structure 140 is formed over the upper surface of the IMD layer 138, as shown in FIGS. 1L-1 and 1L-2, in accordance with some embodiments. The tri-layer mask structure 140 is patterned to form openings 148 which correspond to the first metal lines 136, in accordance with some embodiments. In some embodiments, the openings 148 have different widths.

The tri-layer mask structure 140 includes a bottom layer 142, a middle layer 144, and a top layer 146, in accordance with some embodiments. In some embodiments, the bottom layer 142 is an etching stop layer which protects the IMD layer 138 in the etching process of the patterning the tri-layer mask structure 140. The bottom layer 142 is made of made of nitrogen-free material, such as silicon oxycarbide (SiOC). In some embodiments, the middle layer 144 is hard mask layer 116 which is made of a metal nitride, such as titanium nitride (TiN), tantalum nitride (TaN), or tungsten nitride (WN). In some embodiments, the top layer 146 is an anti-reflective layer (ARC) which is made of is made of tetraethylorthosilicate (TEOS) oxide or a nitrogen-free material such as silicon oxycarbide (SiOC).

The IMD layer 138 is etched using the tri-layer mask structure 140 to form trenches 150, as shown in FIGS. 1M-1 and 1M-2, in accordance with some embodiments. The trenches 150 correspond to the first metal lines 136 and expose the vias 134, in accordance with some embodiments. In some embodiments, the trenches 150 have different widths.

The etching process further removes the second mask elements 128' over the vias 134, in accordance with some embodiments. In some embodiments, the second mask elements 128' are removed in the etching process. In some embodiments, the trenches 150 penetrate through the IMD layer 138 and expose the upper surfaces of the vias 134. In some embodiments, the trenches 150 further expose the upper portions of sidewalls of some the vias 134. In some embodiments, the etching process includes a dry etching process such as RIE, ERC etch, ICP etch, NBE, and/or a combination thereof.

Figures 1, 1N, 2:
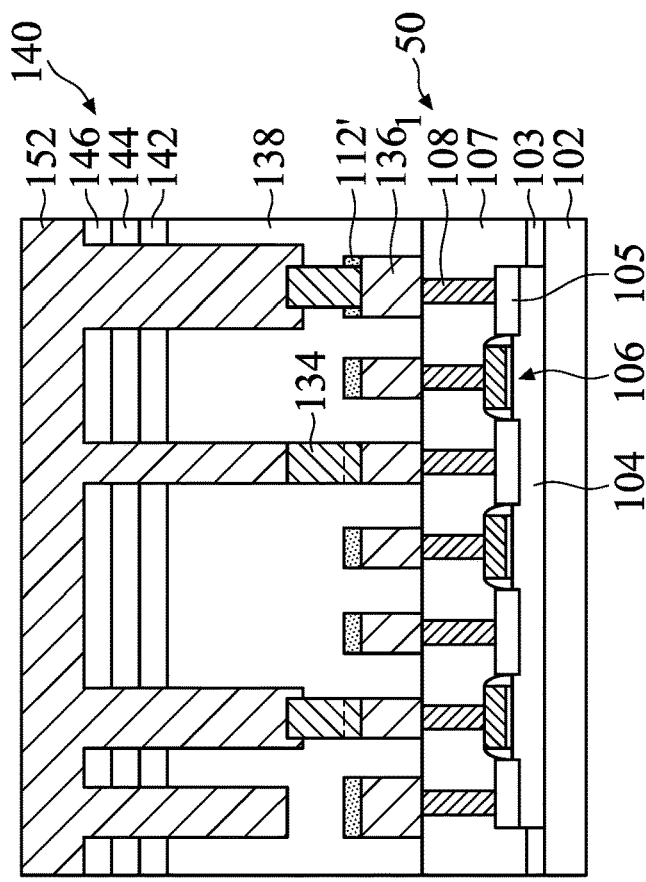
Figures 1, 1N:
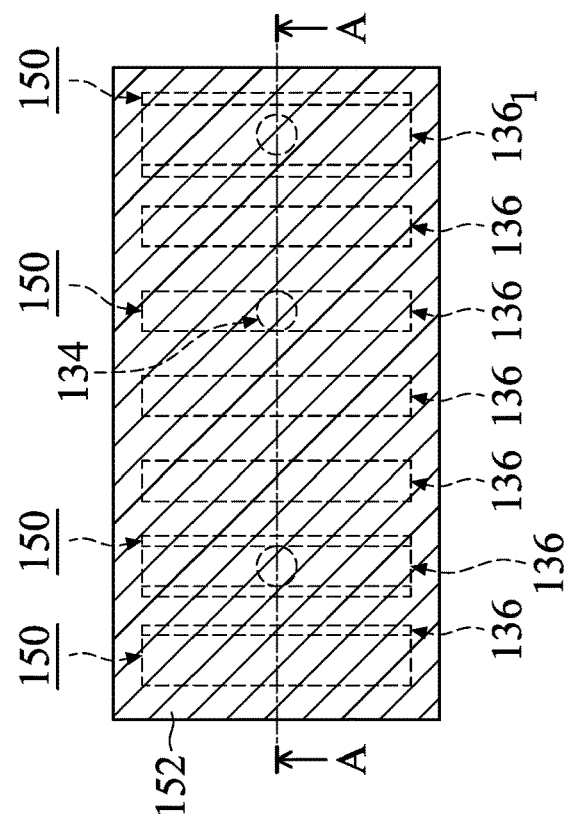
Figures 1, 2, 10:
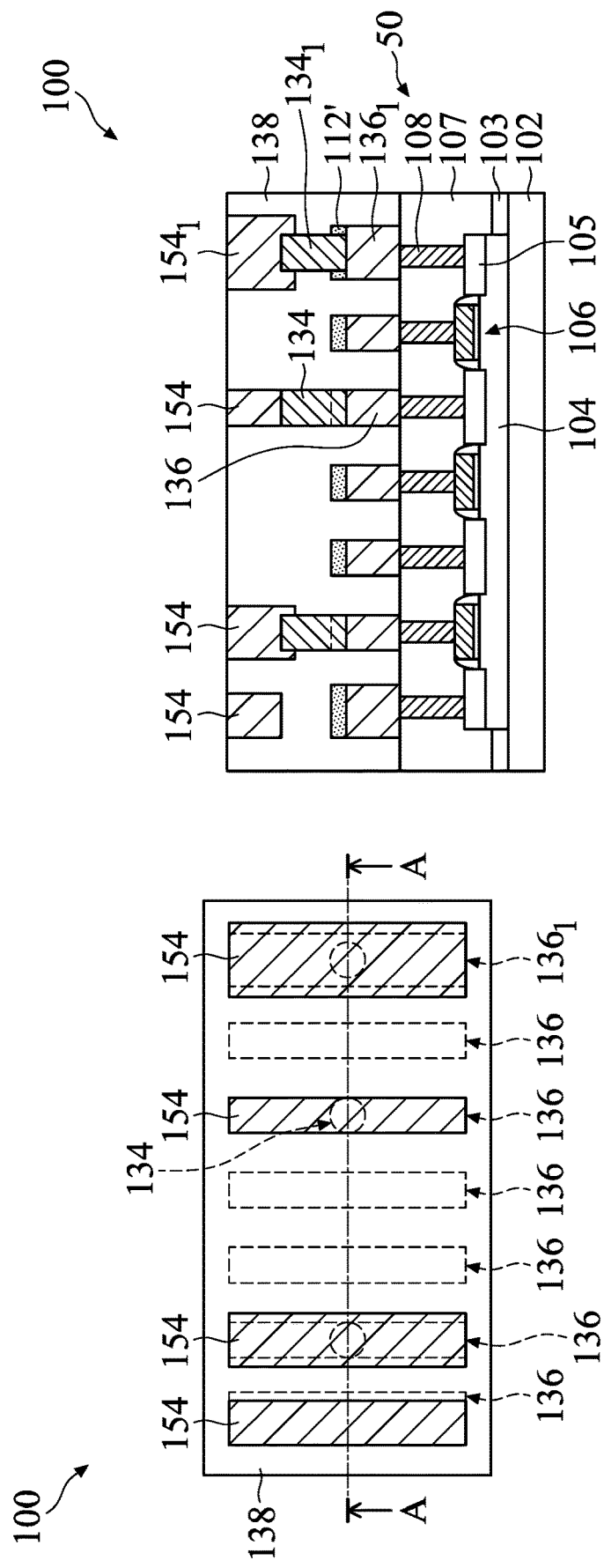

A third metal material 152 is formed over the upper surface of the tri-layer mask structure 140, as shown in FIGS. 1N-1 and 1N-2, in accordance with some embodiments. The third metal material 152 is filled into the trenches 150 to contact the vias 134, in accordance with some embodiments.

In some embodiments, the third metal material 152 is copper (Cu), cobalt (Co), ruthenium (Ru), molybdenum (Mo), multilayers thereof, an alloy thereof, and/or a combination thereof. In some embodiments, the third metal material 152 is formed using electroplating.

The third metal material 152 formed over the upper surface of the tri-layer mask structure 140 is removed to form second metal lines 154, as shown in FIGS. 1O-1 and 1O-2, in accordance with some embodiments. The removal process further removes the tri-layer mask structure 140, in accordance with some embodiments. The removal process includes a planarization process such as CMP, in accordance with some embodiments.

The second metal lines 154 penetrate through the IMD layer 138 to contact the vias 134, in accordance with some embodiments. In some embodiments, the second metal lines 154 have different widths. In some embodiments, the second metal line 154 has the same width as the via 134 and covers the upper surface of the via 134. In some embodiments, the second metal lines $154_1$ has a width greater than the via $134_1$ and covers the upper surface and the upper portions of the sidewalls of the via 134. In some embodiments, the number of the second metal lines 154 is less than the number of the first metal lines.

After the second metal lines 154 are formed, the semiconductor device 100 is obtained.

As the scale of the semiconductor devices continues to shrink, and spacing between adjacent metal lines becomes smaller and smaller, one of the design challenges of forming interconnect structures is to enhance via-to-line overlay performance to improve the via landing area and prevent the formation of voids in vias. Because the second mask elements 128' is used in the etching processes of the first metal material 110 and the second metal material 126 to form the first metal line 136 and the via 134, the via 134 can be self-aligned to the underlying first metal line 136. As a result, the via-to-line overlay performance can be enhanced, which improves the via landing area and reduces the contact resistance (Rc) of vias.

In addition, because the first metal lines 136 and the vias 134 formed using CVD or PVD have a greater grain size than the metal material formed using electroplating, the first metal lines 136 and the vias 134 have a low resistance, in accordance with some embodiments. As a result, the sheet resistance (Rs) of the semiconductor device can be reduced, thereby reducing the resistive-capacitive (RC) delay of the semiconductor device.

Furthermore, compared to a case in which a via is formed by forming a via hole in IMD followed by filling a metal into the via hole, the likelihood of the formation of a void in the via 134 can be eliminated because the via 134 is formed by depositing the second metal material 126 followed by etching the second metal material 126. The void-free via can be more robust, which can lead to improvements in the voltage breakdown (VBD) and the time-dependent dielectric breakdown (TDDB) of the semiconductor device.

In the embodiments shown in FIGS. 1A-1 through 1O-2, the second mask element 128' is aligned to and covers the opening 124 of the first mask element 112'. In the embodiments shown in FIGS. 2A-1 through 2F-2, the second mask elements 128A' is offset from and partially covers the opening 124A of the first mask element 112A'.

Figures 1, 2, 2A:
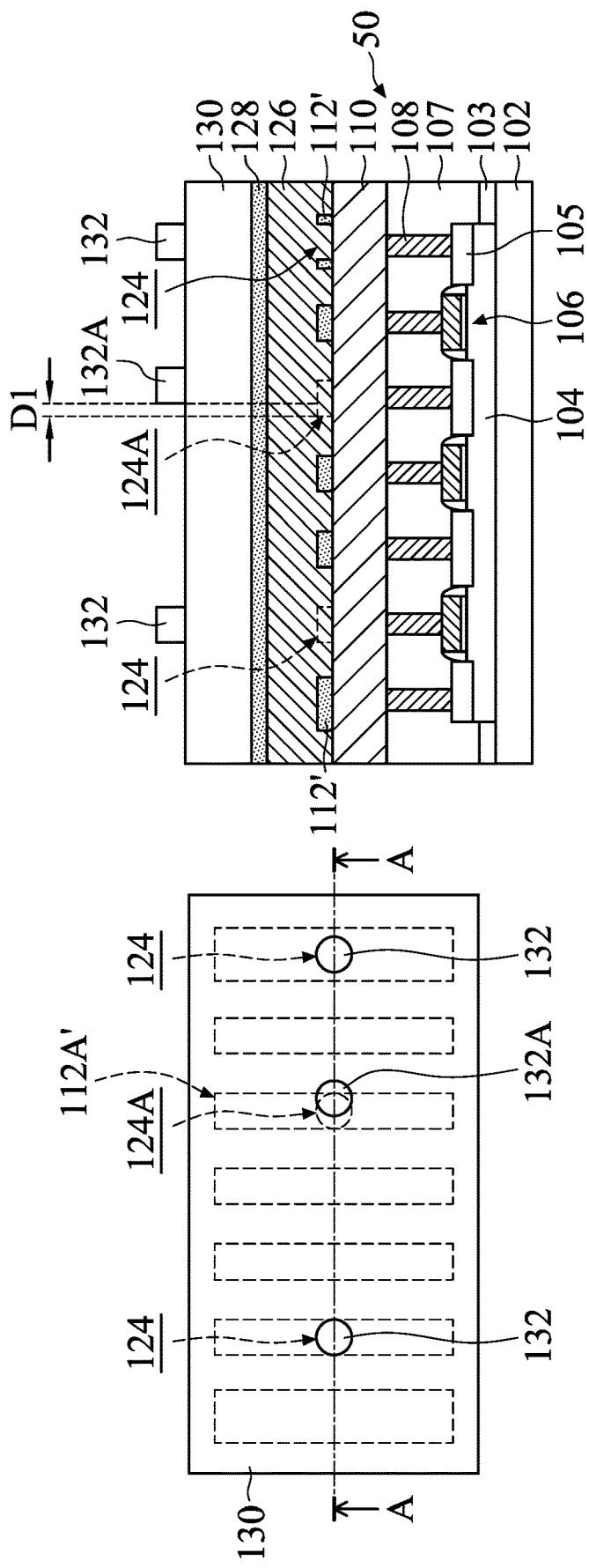
Figures 1, 2, 2B:
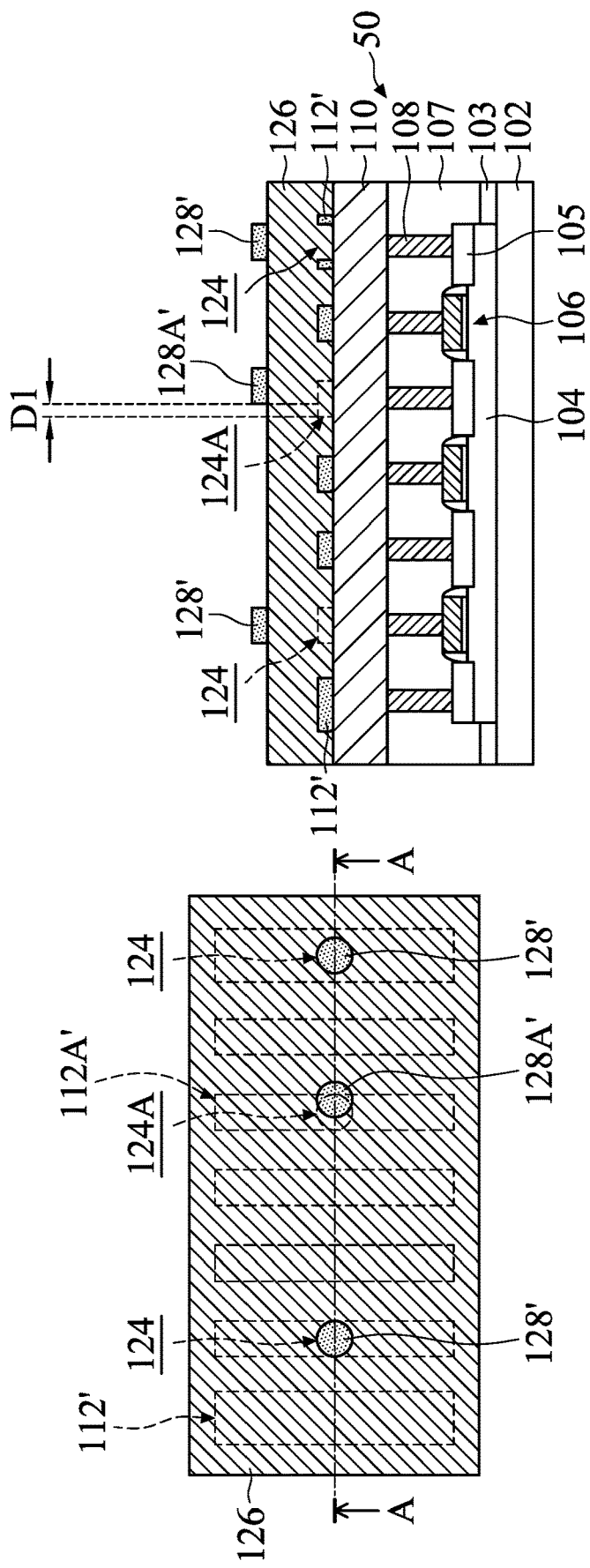
Figures 2, 2C:
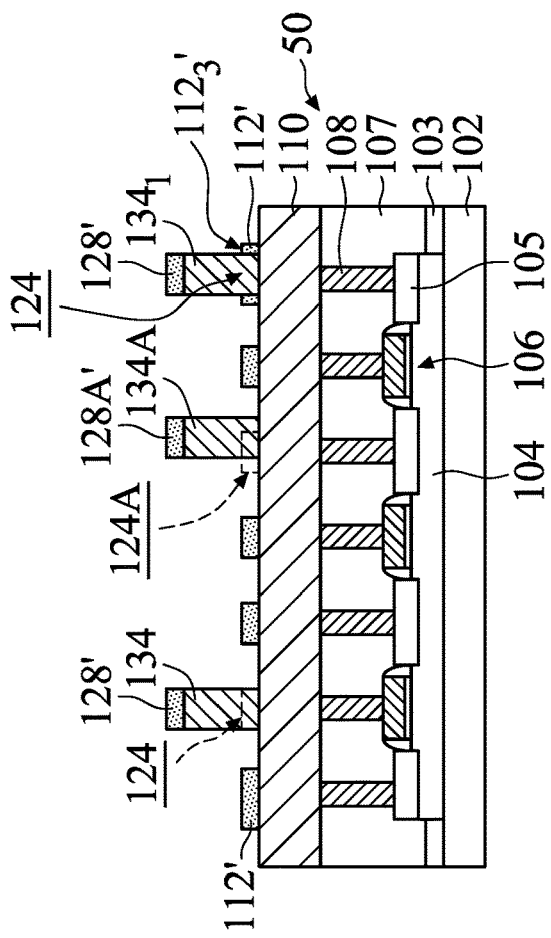
Figures 1, 2C:
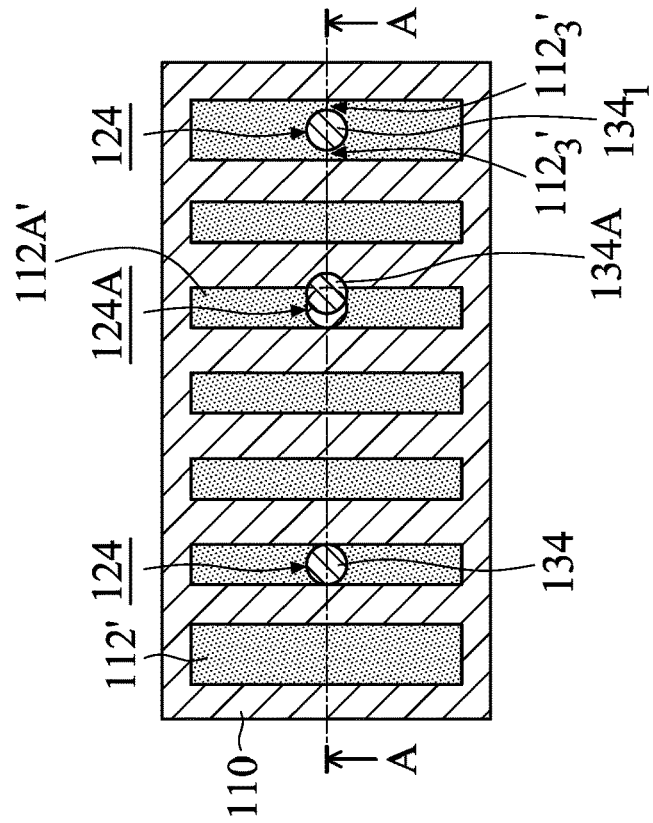
Figures 1, 2, 2D:
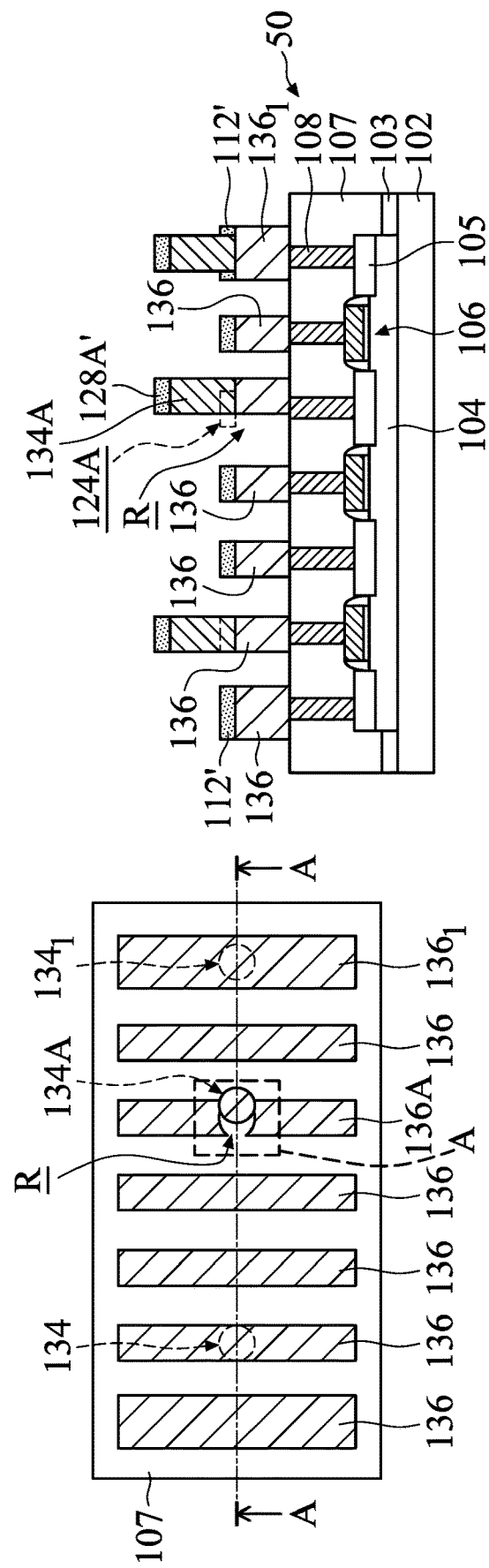
Figures 2, 2D, 3:
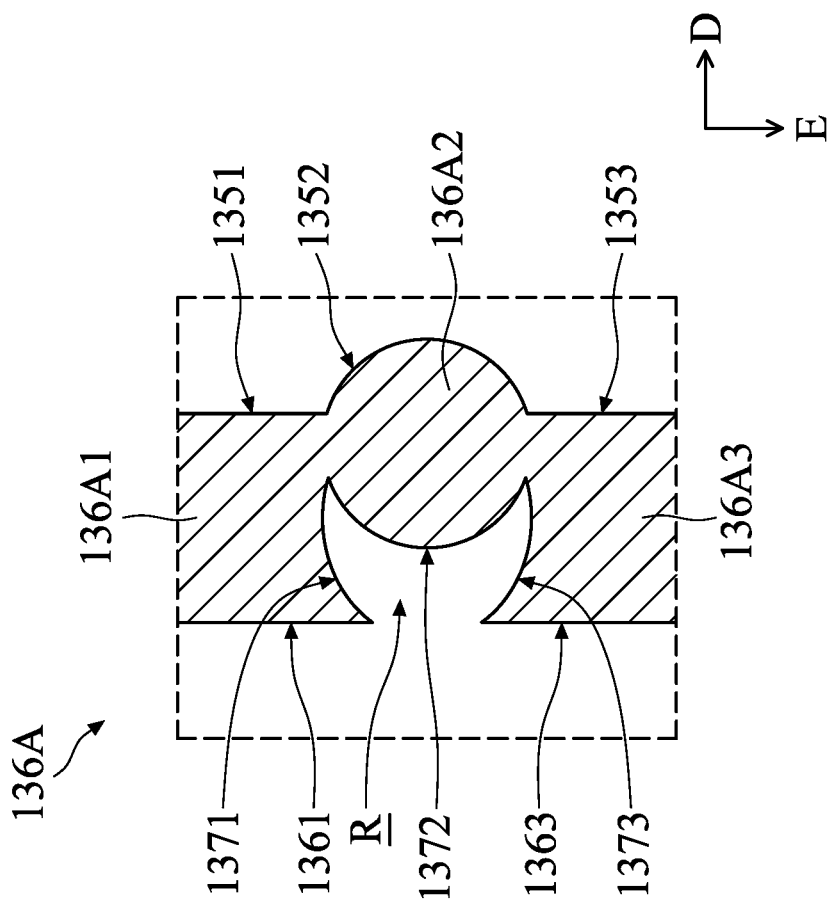
Figures 2, 2F:
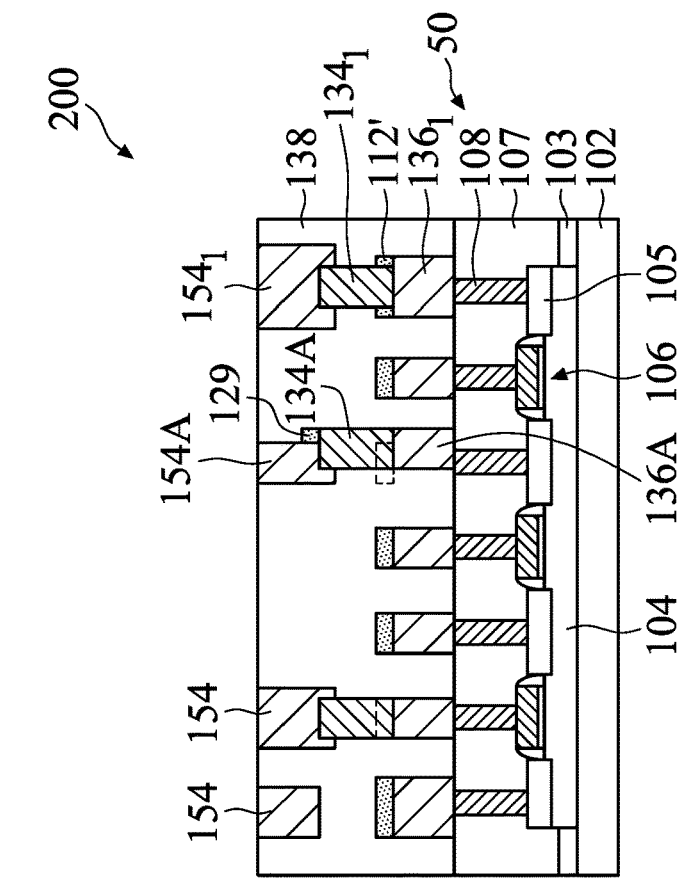
Figures 1, 2F:
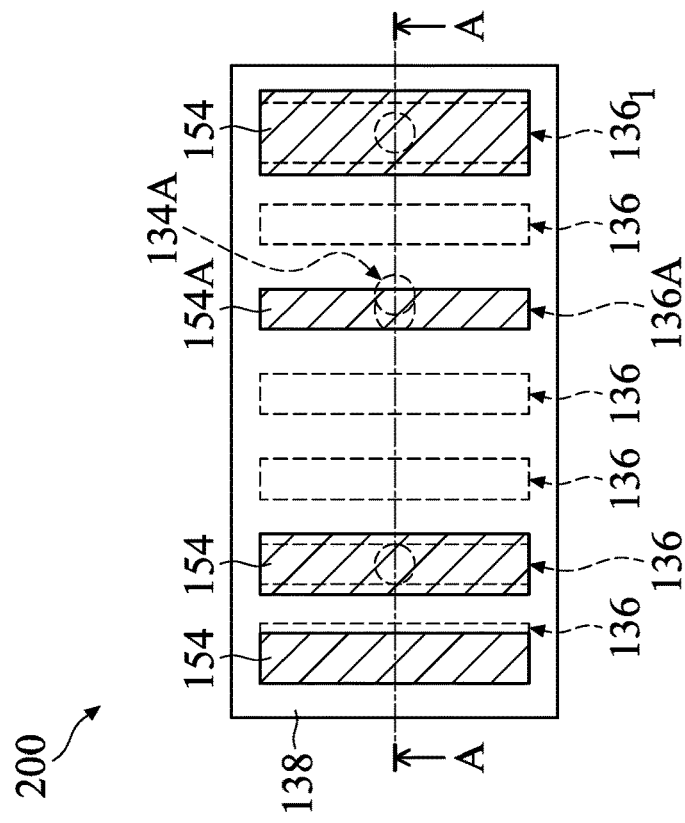

FIGS. 2A-1 through 2F-1 are top views illustrating the formation of a semiconductor device 200 at various intermediate stages, in accordance with some embodiments. FIGS. 2A-2 through 2F-2 are cross-sectional views of the semiconductor device 200 along line A-A in FIGS. 2A-1 through 2F-1, in accordance with some embodiments. FIG. 2D-3 is an enlarged view of region A of FIG. 2D-1, in accordance with some embodiments.

Continuing from FIGS. 1F-1 and 1F-2, photoresist patterns 132 and 132A are formed over the upper surface of the antireflection layer 130, as shown in FIGS. 2A-1 and 2A-2, in accordance with some embodiments. The photoresist pattern 132A is offset from an opening 124A of a first mask element 112A' by a distance D1, in accordance with some embodiments. The photoresist pattern 132A partially covers the opening 124A, in accordance with some embodiments.

The second hard mask layer 128 is patterned into second mask elements 128' and 128A', as shown in FIGS. 2B-1 and 2B-2, in accordance with some embodiments. The second mask element 128A' is offset from the opening 124A of the first mask element 112A' by a distance D1, in accordance with some embodiments. The second mask element 128A' partially covers the opening 124A, in accordance with some embodiments.

The second metal material 126 is etched using the second mask elements 128' and 128A' to form vias 134 and 134A, as shown in FIGS. 2C-1 and 2C-2, in accordance with some embodiments. The second metal material 126 uncovered by the second mask elements 128' and 128A' is removed to expose the first metal material 110, in accordance with some embodiments. After the etching process, the second metal material 126 covered by the second mask elements 128' and 128A' remains to serve as the vias 134 and 134A, in accordance with some embodiments. The via 134A is offset from the first mask element 112A' so that the openings 124A is partially filled by the via 134A, in accordance with some embodiments.

The first metal material 110 is etched using the second mask elements 128' and 128A' and the first mask elements 112' and 112A' to form first metal lines 136 and 136A, as shown in FIGS. 2D-1 and 2D-2, in accordance with some embodiments. The first metal material 110 uncovered by the second mask elements 128' and 128A' and the first mask elements 112' and 112A' is removed to expose the ILD layer 107, in accordance with some embodiments. After the etching process, the first metal material 110 covered by the second mask elements 128' and 128A' and the first mask elements 112' and 112A' remains to serve as the first metal lines 136 and 136A, in accordance with some embodiments. The portion of the first metal material 110 exposed from the opening 124A and uncovered by the second mask elements 128A' is removed to form a recess R, in accordance with some embodiments.

Because the second mask element 128A' is offset from and partially covers the opening 124A of the first mask elements 112A', the first metal line 136A is formed to include two flat portions 136A1 and 136A3 and a protruding portion 136A2, as shown in FIG. 2D-3, in accordance with some embodiments. The protruding portion 136A2 is connected to the flat portions 136A1 and 136A3, in accordance with some embodiments. The protruding portion 136A2 is offset from the flat portions 136A1 and 136A3 in a direction D, in accordance with some embodiments. The direction D is perpendicular to the extending direction E of the first metal lines 136A, in accordance with some embodiments.

The flat portion 136A1 has two opposite flat sidewalls 1351 and 1361 extending in the direction E and a connecting wall 1371 extending in the direction D, in accordance with some embodiments. The flat portion 136A3 has two opposite flat sidewalls 1353 and 1363 extending in the direction E and a connecting wall 1373 extending in the direction D, in accordance with some embodiments.

The protruding portion 136A2 has a first convex sidewall 1352 that is between and protrudes from the flat sidewalls 1351 and 1353 of the flat portions 136A1 and 136A3, in accordance with some embodiments. The protruding portion 136A2 has a second convex sidewall 1372 that is between and indented from the flat sidewalls 1361 and 1363 of the flat portions 136A1 and 136A3, in accordance with some embodiments. The connecting walls 1371 and 1373 are in connection with the second convex sidewall 1372, in accordance with some embodiments.

The via 134A lands on and is overlaid with the protruding portion 136A2 of the first metal line 136A, in accordance with some embodiments. Because the second mask elements 128A' is used in the etching processes of the first metal material 110 and the second metal material 126 to form the first metal line 136A and the via 134A, the via 134A can be self-aligned to the protruding portion 136A2 of the underlying first metal line 136A. As a result, the via-to-line overlay performance can be enhanced, which improves the via landing area and reduces the contact resistance (Rc) of vias.

An IMD layer 138 is formed over the upper surface of the ILD layer 107, as shown in FIGS. 2E-1 and 2E-2, in accordance with some embodiments. The IMD layer 138 covers the sidewalls and the upper surfaces of the first metal lines 136 and 136A, the first mask elements 112' and 112A', the vias 134 and 134A, and the second mask elements 128' and 128A', in accordance with some embodiments. The IMD layer 138 is filled into the recess R of the first metal line 136A, in accordance with some embodiments.

A tri-layer mask structure 140 is formed over the upper surface of the IMD layer 138, as shown in FIGS. 2E-1 and 2E-2, in accordance with some embodiments. The tri-layer mask structure 140 is patterned to form openings 148 (not shown) which correspond to the first metal lines 136 and 136A, in accordance with some embodiments.

The IMD layer 138 is etched using the tri-layer mask structure 140 to form trenches 150 and 150A, as shown in FIGS. 2E-1 and 2E-2, in accordance with some embodiments. The trenches 150 and 150A correspond to the first metal lines 136 and 136A, in accordance with some embodiments.

The etching process partially removes the second mask elements 128A' thereby leaving the remaining portion 129 of the second mask element 128A' over the upper surface of the via 134A, in accordance with some embodiments. In some embodiments, the trench 150A exposes an upper portion of a sidewall of the via 134A.

A third metal material 152 (not shown) is formed over the upper surface of the tri-layer mask structure 140, in accordance with some embodiments. The third metal material 152 is filled into the trenches 150 and 150A to contact the vias 134 and 134A, in accordance with some embodiments.

The third metal material 152 formed over the upper surface of the tri-layer mask structure 140 is removed to form second metal lines 154 and 154A, as shown in FIGS. 2F-1 and 2F-2, in accordance with some embodiments. The removal process further removes the tri-layer mask structure 140, in accordance with some embodiments. The second metal lines 154 and 154A penetrate through the IMD layer 138 to contact the vias 134 and 134A, in accordance with some embodiments. In some embodiments, the upper surface of the via 134A is covered by the second mask element 129 and the second metal line 154A. In some embodiments, the second metal line 154A covers an upper portion of a sidewall of the via 134A.

After the second metal lines 154 and 154A are formed, the semiconductor device 200 is obtained.

As described above, the first metal material 110 is formed over the substrate 102 and the first mask element 112' (or 112A') is formed over the first metal material 110. The first mask element 112' (or 112A') has an opening 124 (or 124A) through the first mask element 112' (or 112A'). The second metal material 126 is formed over the first mask element 112' (or 112A') and the first metal material 110 and in the opening 124 (or 124A), and the second mask element 128' (or 128A') is formed over the second metal material 126 and corresponds to the opening 124 (or 124A). The second metal material 126 and the first metal material 110 are etched using the second mask element 128' (or 128A') and the first mask element 112' (or 112A') to form the via 134 (or 134A) and the first metal line 136 (or 136A) respectively. Because the second mask elements 128' (or 128A') is used in the etching processes of the first metal material 110 and the second metal material 126 to form the first metal line 136 (or 136A) and the via 134 (or 134A), the via 134 (or 134A) can be self-aligned to the underlying first metal line 136 (or 136A). As a result, the via-to-line overlay performance can be enhanced, which improves the via landing area and reduces the contact resistance (Rc) of vias. Furthermore, because the via 134 (or 134A) is formed by depositing the second metal material 126 followed by etching the second metal material 126, the likelihood of the formation of a void in the via 134 (or 134A) can be eliminated. The void-free via can be more robust, which can lead to improvements in the voltage breakdown (VBD) and the time-dependent dielectric breakdown (TDDB) of the semiconductor device.

Embodiments of interconnect structures and methods for forming the same are provided. The method for forming the interconnect structure may include forming a second metal material over a first metal material, and etching the second metal material and the first metal material using the same mask element to form a via and a metal line respectively. As a result, the via-to-line overlay performance may be enhanced.

In some embodiments, a method for forming an interconnect structure is provided. The method for forming the interconnect structure includes forming a first metal material over a semiconductor substrate, and forming a first mask element over the first metal material. The first mask element has an opening through the first mask element. The method for forming the interconnect structure also includes forming a second metal material over the first mask element and the first metal material and in the opening, and forming a second mask element corresponding to the opening and over the second metal material. The method for forming the interconnect structure also includes etching the second metal material and the first metal material using the second mask element and the first mask element to form a via and a first metal line respectively.

In some embodiments, a method for forming an interconnect structure is provided. The method for forming the interconnect structure includes forming a first metal material over a semiconductor structure, forming a first mask element over the first metal material, and patterning the first mask element to form an opening exposing the first metal material. The method for forming the interconnect structure also includes forming a second metal material filling the opening and covering the first mask element, and forming a second mask element over the second metal material. The method for forming the interconnect structure also includes etching the second metal material using the second mask element to form a via, and etching the first metal material using the first mask element and the second mask element to form a metal line.

In some embodiments, an interconnect structure is provided. The interconnect structure includes a dielectric layer over a semiconductor substrate, a first metal line in the dielectric layer, and a via over the first metal line and in the dielectric layer. The first metal line includes two flat portions and a protruding portion which is connected to the two flat portions and is offset from the two flat portions in a direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an interconnect structure, comprising:
    forming a gate structure over a substrate;
    forming a contact over the gate structure;
    forming a first metal material over the contact;
    forming a first mask element over the first metal material, wherein the first mask element has an opening through the first mask element;
    forming a second metal material over the first mask element and the first metal material and in the opening;
    forming a second mask element corresponding to the opening and over the second metal material; and
    etching the second metal material exposed by the second mask element and the first metal material exposed by both the second mask element and the first mask element to form a via and a first metal line respectively.

2. The method for forming the interconnect structure as claimed in claim 1, wherein forming the first mask element comprises:
    forming a dielectric material over the first metal material;
    patterning the dielectric material using a photoresist pattern a to have a strip shape; and after patterning the dielectric material to have the strip shape, patterning the dielectric material using a patterned photoresist layer to form the opening which exposes the first metal material.

3. The method for forming the interconnect structure as claimed in claim 1, wherein the second metal material and the first metal material are etched using an RIE process.

4. The method for forming the interconnect structure as claimed in claim 1, wherein the first mask element is made of SiN, SiOC, SiCN, AlON, or $Al_2O_3$.

5. The method for forming the interconnect structure as claimed in claim 1, further comprising:
   forming a dielectric layer over the semiconductor substrate and covering the first metal line and the via;
   etching the dielectric layer to form a trench exposing the via; and
   forming a second metal line in the trench.

6. The method for forming the interconnect structure as claimed in claim 5, wherein etching the dielectric layer further comprises removing the second mask element.

7. The method for forming the interconnect structure as claimed in claim 5, wherein the trench exposes a sidewall and an upper surface of the via.

8. The method for forming the interconnect structure as claimed in claim 5, wherein forming the second metal line comprises:
   forming a third metal material over the dielectric layer and in the trench; and
   removing the third metal material over the dielectric layer.

9. A method for forming an interconnect structure, comprising:
   forming a first metal material over a semiconductor structure;
   forming a first mask element over the first metal material;
   patterning the first mask element to form an opening exposing the first metal material;
   forming a second metal material filling the opening and covering the first mask element;
   forming a second mask element over the second metal material;
   etching the second metal material using the second mask element to form a via; and
   etching the first metal material using the first mask element and the second mask element to form a metal line, wherein the metal line has two flat sidewalls and a convex sidewall protruding from the two flat sidewalls.

10. The method for forming the interconnect structure as claimed in claim 9, wherein the second metal material and the first metal material are etched in a same chamber.

11. The method for forming the interconnect structure as claimed in claim 9, wherein the second mask element covers the opening.

12. The method for forming the interconnect structure as claimed in claim 9, wherein the second mask element is offset from the opening.

13. The method for forming the interconnect structure as claimed in claim 9, wherein the first metal material is etched to remove a portion of the first metal material which is exposed from the opening and uncovered by the second mask element.

14. The method for forming the interconnect structure as claimed in claim 9, further comprising:
   forming a dielectric layer over the semiconductor substrate to cover the metal line and the via;
   etching the dielectric layer to form a trench corresponding to the first metal line; and
   filling the trench with a third metal material.

15. The method for forming the interconnect structure as claimed in claim 14, wherein etching the dielectric layer further comprises partially removing the second mask element thereby leaving a remaining portion of the second mask element over the via.

16. A method for forming an interconnect structure, comprising:
   forming a source/drain feature over a fin structure;
   forming a contact on the source/drain feature;
   forming a first metal material over the contact forming a first mask element over the first metal material, wherein the first mask element has a first opening exposing the first metal material, wherein in a top view, the first mask element has two segments on the opposite sides of the first opening and a connecting portion in connection with the two segments;
   forming a second metal material over the first mask element and the first metal material;
   forming a photoresist pattern over the second metal material, wherein the photoresist pattern overlaps at least a portion of the first opening;
   etching the second metal material using the photoresist pattern to form a via; and
   after etching the second metal material, etching the first metal material using the first mask element to form a first metal line.

17. The method for forming the interconnect structure as claimed in claim 16, wherein the via fills at least a portion of the first opening.

18. The method for forming the interconnect structure as claimed in claim 16, further comprising:
   forming a second mask element over the first metal material while forming the first mask element over the first metal material, wherein the second mask element and first mask element are separated from one another, the second metal material is formed over the second mask element, and the second mask element has a second opening exposing the first metal material; and
   etching the first metal material using the second mask element to form a second metal line.

19. The method for forming the interconnect structure as claimed in claim 16, wherein in a top view, the photoresist pattern has a round shape, and the round shape of the photoresist pattern is entirely confined within an area of the first mask element.

20. The method for forming the interconnect structure as claimed in claim 16, wherein the second metal material entirely fills the first openings and has a continuous and substantially flat upper surface.

* * * * *